United States Patent [19]

Adair

[11] Patent Number: 4,508,807

[45] Date of Patent: Apr. 2, 1985

[54] PHOTOSENSITIVE MATERIAL EMPLOYING ENCAPSULATED RADIATION SENSITIVE COMPOSITION AND A TRANSPARENTIZABLE IMAGE-RECEIVING LAYER

[75] Inventor: Paul C. Adair, Chillicothe, Ohio

[73] Assignee: Mead Corporation, Dayton, Ohio

[21] Appl. No.: 512,268

[22] Filed: Jul. 11, 1983

[51] Int. Cl.$^3$ .......................... G03C 1/40; G03C 1/00
[52] U.S. Cl. .................... 430/138; 430/211; 430/235
[58] Field of Search .............. 430/138, 211, 235; 428/320.6; 282/275

[56] References Cited

U.S. PATENT DOCUMENTS

| | | | |
|---|---|---|---|
| 2,953,454 | 9/1960 | Berman | 430/345 |
| 3,001,873 | 9/1961 | Foris | 430/138 |
| 3,072,481 | 1/1963 | Berman et al. | 430/138 |
| 3,090,687 | 5/1963 | Berman | 430/138 |
| 3,116,148 | 12/1963 | Miller | 430/138 |
| 3,181,965 | 7/1965 | Michelotti | 430/271 |
| 3,219,446 | 11/1965 | Berman | 430/138 |
| 3,236,717 | 2/1966 | Adhikary | 430/271 |
| 3,576,660 | 4/1971 | Bayless et al. | 428/402.2 |
| 3,700,439 | 10/1972 | Phillips | 430/138 |
| 3,736,139 | 5/1973 | Yamashita et al. | 430/353 |
| 3,892,569 | 7/1975 | Speers | 430/541 |
| 4,149,887 | 4/1979 | Levy | 430/138 |
| 4,173,475 | 11/1979 | Chandross et al. | 430/290 |
| 4,399,209 | 8/1983 | Sanders | 430/138 |

FOREIGN PATENT DOCUMENTS

| | | |
|---|---|---|
| 6917733 | 8/1969 | Japan . |
| 746212 | 2/1974 | Japan . |
| 7734488 | 9/1977 | Japan . |
| 789519 | 1/1978 | Japan . |
| 789520 | 1/1978 | Japan . |
| 82124343 | 8/1982 | Japan . |
| 82179836 | 11/1982 | Japan . |
| 82197538 | 12/1982 | Japan . |
| 8317432 | 2/1983 | Japan . |
| 8323024 | 2/1983 | Japan . |
| 8323025 | 2/1983 | Japan . |
| 8345084 | 3/1983 | Japan . |
| 8345090 | 3/1983 | Japan . |
| 1001831 | 8/1965 | United Kingdom . |
| 1001832 | 8/1965 | United Kingdom . |
| 1058798 | 2/1967 | United Kingdom . |
| 1141475 | 1/1969 | United Kingdom . |
| 1193923 | 6/1970 | United Kingdom . |

OTHER PUBLICATIONS

"What's Ahead", Lloyd E. Varden, Modern Photography, p. 86, 1958.

*Primary Examiner*—John E. Kittle
*Assistant Examiner*—John L. Goodrow
*Attorney, Agent, or Firm*—Biebel, French & Nauman

[57] ABSTRACT

An imaging material in which images are formed by exposing a sheet having on a surface a layer of microcapsules containing a radiation sensitive internal phase, and rupturing the microcapsules; wherein images in the form of transparent windows are formed in an opaque image-receiving layer containing a light-scattering pigment by rendering the pigment transparent with the internal phase released from the ruptured microcapsules.

18 Claims, 4 Drawing Figures

PHOTOSENSITIVE MATERIAL EMPLOYING ENCAPSULATED RADIATION SENSITIVE COMPOSITION AND A TRANSPARENTIZABLE IMAGE-RECEIVING LAYER

BACKGROUND OF THE INVENTION

The present invention relates to a photosensitive material in which a radiation sensitive composition is encapsulated in a plurality of microcapsules and exposure of the composition controls the release of the internal phase from the microcapsules and the formation of an image. More particularly, the present invention relates to a photosensitive material of the aforementioned type wherein the internal phase released from the microcapsules in the image areas transparentizes an otherwise opaque image-receiving layer and images in the form of transparent windows in an opaque background are formed.

Photosensitive materials employing encapsulated radiation sensitive compositions are the subject of commonly assigned U.S. Pat. Nos. 4,399,209 and 4,440,846. In these applications, images are formed by reacting a color precursor with a color developer. The color precursor is typically encapsulated with a radiation sensitive composition such as a composition containing a polyethylenically unsaturated monomer. By image-wise exposing the material to actinic radiation and rupturing the microcapsules in contact with a developer sheet, the color precursor is only released in the areas in which images are formed and a dye image (the reaction product of the color precursor and the color developer) is obtained.

Other imaging systems employing photosensitive microcapsules include:

Berman, U.S. Pat. No. 3,219,446 discloses a transfer imaging process in which a blue-black dye is encapsulated with a photocrosslinkable polymer or a photopolymerizable monomer in a film or a layer of discrete microcapsules. In this system imaging is accomplished by image-wise exposing the layer of the encapsulated material to electromagnetic radiation to crosslink the polymer or polymerize the monomer. This is said to cause the liquid in the exposed microcapsules to assume a non-liquid, rigid condition, such that upon rupturing the microcapsules only the dye from the unexposed microcapsules is transferred to a receiving sheet where images are formed.

Phillips, U.S. Pat. No. 3,700,439, discloses a process wherein Michler's ketoneis encapsulated in a conventional manner and provided as a layer on a support. Michler's ketone is not a color former, but irradiation of the ketone converts it to a colorless, acid colorable, dye precursor. Thus, by image-wise exposing the Phillips material to actinic radiation and rupturing the microcapsules in contact with an acid developer layer, such as a layer of acid clay, a visible image is obtained in the areas in which the ketone has been converted to the acid colorable form by irradiation. Phillips also discloses a self-contained system in which the acid developer is on the same support as the microcapsules containing the Michler's ketone.

Levy, U.S. Pat. No. 4,149,887, relates to a microcapsule-containing imaging material having a photoconductive internal phase which is exposed in an RF field. Exposure increases the conductivity of the internal phase and causes the microcapsules to heat, swell and then rupture in the exposed areas thereby freeing the contents to form images. The microcapsules may contain color precursors which form images by reacting with a developing agent.

Japanese Kokai No. 6212/1974 to Matsushita Denki Sangyo K.K., relates to a recording material in which microcapsules having a photocrosslinkable polymer wall contain a colorless or substantially colorless precursor in a polar solvent and, optionally, an acid dye developer. The polar solvent prevents the color precursor from reacting with the acid dye developer and forming a color image. Images are formed by image-wise exposing the material to actinic radiation and rupturing the microcapsules in the unexposed areas, whereupon the polar solvent evaporates and color development occurs.

Japanese Kokai Nos. 9519 and 9520/1978 to K.K. Rikoh, relate to imaging systems in which the microcapsules contain a radiation curable internal phase including a dye precursor. Images are formed by image-wise exposing a layer of the microcapsules to light and selectively transferring the microcapsules from the unexposed areas to a receiving sheet. The microcapsules are not ruptured. Upon subsequent wet development processing of the transfer sheet with a dye developer, the dye precursor in the microcapsules is converted to a colored form and an image is obtained.

British Pat. Nos. 1,001,832; 1,058,798; 1,141,475; and 1,193,923 to DuPont relate to imaging materials which employ a photopolymerizable substratum comprising a solid binder having a polymerizable ethylenically unsaturated compound dispersed therein. Images are formed by image-wise exposing the materials to actinic radiation. Exposure controls the rate of diffusion of a developer into or out of the photopolymerizable substratum. In the case of '798, a dye or color precursor is present in the microcapsules and images are formed by bringing a receiving sheet, such as plain or coated paper, into contact with a substratum and heating the two in combination such that the dye diffuses from the unexposed areas of the substratum to the receiving sheet. In the case of '475, at least one of a color former, developer and oxidizing agent is present in the dispersed phase and the substratum is hardened in the exposed areas thereby altering the rate of diffusion of an externally applied reactant into the substratum.

SUMMARY OF THE INVENTION

The term "microcapsule" is used herein to refer to both microcapsules having a discrete microcapsule wall and microcapsules formed in an open phase system wherein discrete droplets of internal phase are dispersed in a binder. Thus, whenever reference is made to "microcapsules" or "encapsulation" in the specification and appended claims without reference to a discrete microcapsule wall both types of microcapsules are intended.

The imaging material of the present invention, in its simplest form, comprises a layer of rupturable microcapsules having an internal phase, which includes or consists of a radiation sensitive composition; and an image-receiving layer in which a light scattering pigment is dispersed in a binder. In accordance with the invention, the pigment making up the image-receiving layer is a material which scatters incident light in its dry form, but has an index of refraction which matches, or is substantially the same as, the index of refraction of the internal phase, such that when the pigment is viewed immersed in the internal phase, it appears transparent.

By using exposure to control the release of the internal phase from the microcapsules and its transfer to the image-receiving layer, images in the form of transparent windows are formed in the opaque image-receiving layer. The pigment appears transparent in the image-receiving areas coated with the released internal phase.

The present invention also includes a process for imaging using the aforesaid material, wherein the photosensitive material is image-wise exposed to actinic radiation and then developed by rupturing the microcapsules such that they image-wise release the internal phase, which subsequently interacts with the image-receiving layer, rendering it transparent in the image areas. The microcapsules can be ruptured by pressure, or by other means described below.

Both positive-working and negative-working systems are available depending upon whether the internal phase is a photohardenable or photosoftenable material and increases or decreases in viscosity upon exposure. With a positive working system, such as one employing a radiation curable material as the internal phase, the internal phase is released from the unexposed areas of the microcapsule-containing layer, but, due to the polymerization of the internal phase, is prevented from releasing in the exposed areas. With a negative working system, such as a photodepolymerizable polymer, the internal phase is released from the exposed areas.

The microcapsule-containing layer and the image-receiving layer can be arranged on the same or independent supports. In the former case, a so-called self-contained imaging sheet is obtained which can be exposed and developed as an integral unit. In the latter case, images are obtained using a transfer technique. The microcapsule-containing sheet (hereafter the "transfer sheet") is separately exposed first and then assembled with the sheet carrying the image-receiving layer for development. With the self-contained sheet, the internal phase migrates from the ruptured microcapsules to the image-receiving layer. In the transfer system, the microcapsules are typically ruptured in contact with the image-receiving sheet (although they can be ruptured separately) whereupon the internal phase transfers to the image-receiving sheet where it produces a transparent image.

The image-receiving sheet may be transparent, black, or colored depending upon the application of the imaging material. For many applications it is desirable to view the image through the image-receiving layer on a black or colored background. Clearly, the support itself may be colored or a colored layer may be inserted between the image-receiving layer and the support.

DETAILED DESCRIPTION OF THE INVENTION

Figure 1:
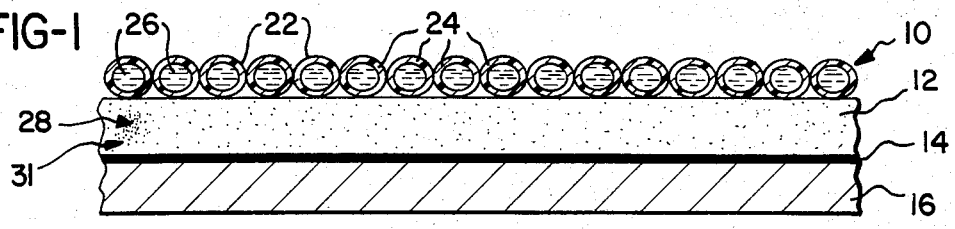
FIG. 1 is a cross-sectional view of a self-contained sheet in accordance with the present invention.
Figure 2:
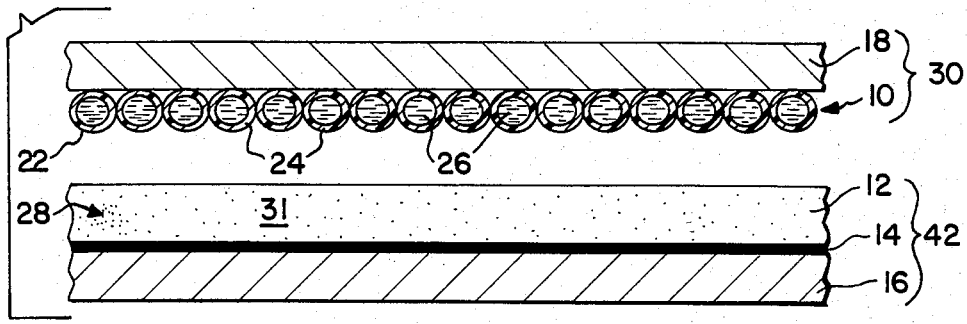
FIG. 2 is a cross-sectional view of a transfer material in accordance with the present invention.
Figure 3:
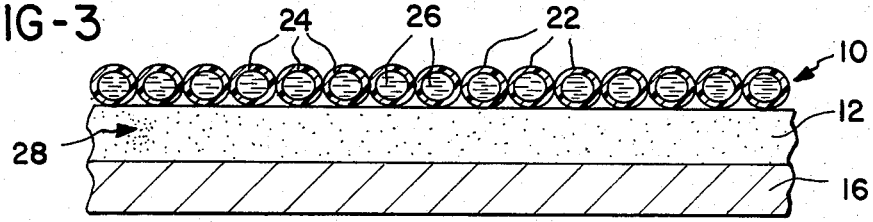
FIG. 3 is a cross-sectional view of a self-contained sheet for forming transparencies.

Two typical embodiments of photosenstive materials in accordance with the present invention are shown in FIGS. 1 and 2 wherein the microcapsule-containing layer and the image-receiving layer are designated by the numerals 10 and 12, respectively. FIG. 1 is a self-contained imaging sheet wherein the microcapsule-containing layer 10 and the image-receiving layer 12 are carried on the same support 16 with an optional color layer 14 interposed between the layer 12 and the support 16. Where a transparency is desired, the color layer 14 can be omitted as shown in FIG. 3 where a self-contained sheet for forming transparencies is illustrated and like elements are numbered as in FIG. 1. FIG. 2 illustrates a transfer material wherein the microcapsule-containing layer 10 is carried on a separate support 18 forming a transfer sheet 30, and the image-receiving layer 12 and backup layer 14 are provided on support 16 as an image-receiving sheet 42.

In the illustrated embodiments, the microcapsule-containing layers 10 include a plurality of microcapsules 22 having discrete walls 24 and an internal phase 26. For purposes of this illustration the microcapsules are assumed to contain a radiation curable material and hence the internal phase is shown as being liquid prior to exposure and being transformed into a solid by exposure. Embodiments are also possible in which the microcapsules contain a photosoftenable material in which the internal phase is solid or semisolid (e.g. gelatinous) prior to exposure and transformed to a liquid or less viscous form upon exposure as previously mentioned. Furthermore, the microcapsules shown in the drawings are not drawn to scale. In reality a much larger number of microcapsules are exposed and ruptured in producing images as described herein.

The image-receiving layer 12 basically comprises a pigment 28 dispersed in a binder 31. The pigment selected for the image-receiving layer is one which scatters incident light in its dry form but transmits light when it is coated or immersed in a medium having a matching index of refraction. The pigment is described in more detail below. By dispersing the pigment in a binder and selecting a material having a similar index of refraction for the internal phase (e.g., a photohardenable material), the image-receiving layer can be transparentized in the areas in which the internal phase is released from the microcapsules and contacts the image-receiving layer.

Figure 4:
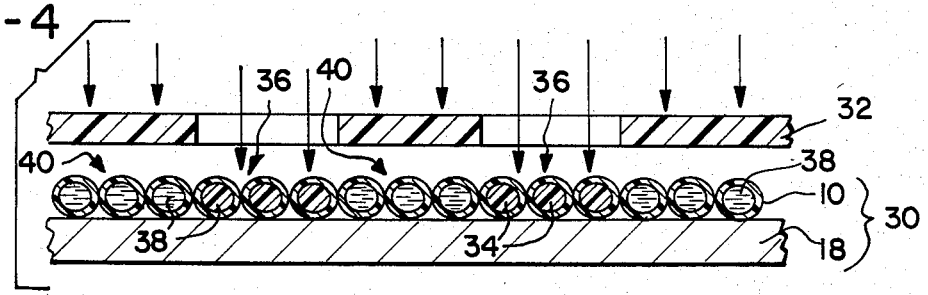
FIG. 4 illustrates exposure of a microcapsule-containing transfer sheet.

Exposure of the photosenstive materials is illustrated in FIG. 4 wherein the microcapsule-containing layer 10 from a transfer sheet 30 is shown being exposed to incident actinic radiation (arrows) through a mask 32. For materials employing a photohardenable material, as illustrated, incident radiation hardens the internal phase 34 in the exposed areas 36. The internal phase remains liquid in the unexposed areas 40. Although internal phase 34 is shown as being completely solid in the exposed areas 36, it is not necessary that the exposure completely harden the internal phase in the exposed areas as long as there is a sufficient change in the internal viscosity to control imaging. The consistency of the internal phase in the exposed areas may range from a very viscous fluid to a soft semisolid or solid form provided the internal phase is not released from the microcapsules upon development. In some cases it may be desirable to have areas where the internal phase is not entirely hardened or is hardened to an intermediate degree in proportion to the degree of exposure. Such imaging materials release the internal phase in proportion to the degree of exposure and provide good half tone gradation.

Following exposure, the transfer sheet is assembled with the image-receiving sheet and the microcapsules are ruptured. Typically, the microcapsules are ruptured by passing the exposed transfer sheet and the image-receiving sheet through the nip between two pressure rollers. Other means than pressure can also be used, however. For example, the microcapsules can be ruptured by heat, abrasion, solvent vapor and the like. With a self-contained sheet, the sheet is passed through the rollers as a unit.

As explained in more detail in commonly assigned application Ser. No. 320,356, it is not clear whether the microcapsules in the image areas and the non-image areas rupture but only the microcapsules in the image areas release their contents or whether only the microcapsules in the image areas rupture. It is probable that a combination of both phenomena occurs.

The pigments used in the image-receiving layers of the present invention are characterized in that they scatter light incident the image-receiving layer and thereby render it opaque, but, when immersed in a liquid phase having a matching index of refraction, they transmit incident radiation. As a general rule, the light scattering pigments used in the present invention are substantially colorless, preferably white, particles having a particle size in the range of about 0.05 to 5 microns and an index of refraction less than 1.7. The index refraction of the pigments is usually in the range of about 1.3 to 1.7 because most of the organic materials incorporated in the internal phase have indexes of refraction in this range. Representative examples of the pigments used in the present invention include non-film forming polymer latexes (e.g., Dylex 1183 polystyrene pigment and Pergopak urea formaldehyde resin powder) and certain inorganic pigments such as silica, diatomaceous earth, magnesium silicate and calcium carbonate.

The image-receiving layer is formed by dispersing the pigment in a binder and coating this composition on a support. The thickness of the image-receiving layer must be sufficient that the layer appears opaque but can be transparentized by the internal phase. It will depend on the size and coat weight of capsules and the nature of the pigment. It will also vary for transfer and self-contained sheets. Generally, the image-receiving layer ranges from about 1 to 8 mils in thickness.

Typical examples of binders useful in forming the image-receiving layer are film-forming latexes (e.g., Rhoplex P-310 a product of Rohm and Haas Co.), gelatin, poly (vinyl alcohol), starch, etc. but any substantially transparent binder which is compatible with the pigment can be used. The amount of binder is preferably held to a minimum in order to maximize the light scattering properties of the pigment and minimize the amount of pigment required to make the layer opaque. The exact amount will vary with the type and size of the pigment. Typically the amount of binder ranges from about 1 to 2% by volume.

A number of factors contribute to the photographic properties and the image quality of any imaging system employing an encapsulated photosensitive material such as the size and uniformity of the microcapsules, the composition of the radiation sensitive materials, the nature of the microcapsule walls, etc. Two factors which are particularly important in determining the photographic properties of the photosensitive material of the present invention are the amount of internal phase released from the microcapsules and the thickness of the image-receiving layer. The amount of internal phase released from the microcapsules in the image areas must be sufficient to coat the pigment in the image-receiving layer so as to extinguish its light-scattering property and render the layer transparent in the image areas. As the image-receiving layer increases in thickness, more internal phase must be released upon development to render the layer transparent. Accordingly, as a general rule, the image-receiving layer should not be thicker than necessary for opacity. The amount of internal phase released can be adjusted based on the nature of the internal phase, the size of the microcapsules and the microcapsule distribution.

The encapsulated radiation sensitive compositions used in the present invention undergo a change in viscosity upon exposure to actinic radiation. The term "actinic radiation" includes the entire electromagnetic spectrum (e.g., U.V., I.R., visible, x-ray, and ion or electron beam radiation). These compostions may be positive working or negative working depending upon the nature of the radiation sensitive composition in the internal phase. Where the radiation sensitive composition contains a photohardenable composition (e.g., a photopolymerizable or photocrosslinkable material), the internal phase solidifies or increases in viscosity in the exposed areas. Positive images are formed. On the other hand, where the microcapsules contain a photosoftenable material in the internal phase, the internal phase is released in the exposed areas and negative images are formed.

Typical positive-working radiation sensitive compositions include a photoinitiator in combination with a monomer, a dimer, or an oligomer, which is polymerizable to a higher molecular weight compound, or a polymer which is crosslinked upon exposure. For a negative working material a compound which is depolymerized or otherwise decomposed upon exposure is used.

Ethylenically unsaturated organic compounds are useful radiation curable materials. These compounds contain at least one terminal ethylene group per molecule. Typically, they are liquid. Ethylenically unsaturated compounds having two or more terminal ethylene groups per molecule are preferred. An example of this preferred subgroup are ethylenically unsaturated acid esters of polyhydric alcohols, such as trimethylol propane triacrylate (TMPTA).

Another suitable radiation sensitive composition is an acrylate prepolymer derived from the partial reaction of pentaerythritol with acrylic acid or acrylic acid esters. Photosensitive compositions based on these prepolymers having an acrylate functionality of between approximately two and three are available commercially in two-package systems from The Richardson Company, Melrose Park, Ill., such as RL-1482 and RL-1483. These are recommended to be mixed together to form a radiation curable clear varnish in a ratio of 4.4 parts of RL-1482 to one part RL-1483.

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including these isocyanate modified esters and reactive diluents such as tetraethylene glycol diacrylate as well as photoinitiators such as chlorinated resins, chlorinated paraffins and amine photoinitiation synergists are commercially available as over print varnishes from Sun Chemical Corp., Carlstat, N.J., under the tradename of Sun Cure resins.

The radiation sensitive component of several radiation curable inks is also suitable for use in this invention.

An example of this type of material is a mixture of pentaerythritol acrylate and a halogenated aromatic, alicyclic or aliphatic photoinitiator, as disclosed in U.S. Pat. No. 3,661,614 to Bessemir et al.

An example of radiation depolymerizable materials that may be useful in other embodiments of the invention are 3-oximino-2-butanone methacrylate which undergoes main chain scission upon U.V. exposure and poly 4'-alkyl acylophenones. See Reichmanis, E.; *Am. Chem. Soc. Div. Org. Coat. Plast. Chem. Prepr.* 1980. 43, 243–251 and Lukac, I.; Chmela S., Int. Conf. on Modif. Polym. 5th. Bratislave, Czech. July 3–6, 1979, I.U.P.-.A.C. Oxford, England 1979, 1, 176–182.

The radiation sensitive composition must make up a large enough proportion of the internal phase to effectively control the flow of the internal phase upon development. This generally means that the radiation sensitive material must constitute approximately 40 to 99% by weight of the internal phase of the microcapsules.

In most cases, the radiation sensitive composition includes a photoinitiator. It is possible to use either homolytic photoinitiators which are converted to an active species by radiation and generate a radical by abstracting a hydrogen from a hydrogen donor. There may also be used photoinitiators which complex with the sensitizer to produce a free radical generating species or photoinitiators which otherwise generate radicals in the presence of a sensitizer. If the system relies upon ionic polymerization, the photoinitiator may be the anion or cation generating type, depending on the nature of the polymerization.

Examples of photoinitiators useful in the present invention include diaryl ketone derivatives, and benzoin alkyl ethers. Where ultraviolet sensitivity is desired, suitable photoinitiators include alkoxy phenyl ketones, O-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes.

In many cases it is advantageous to use a combination of imaging photoinitiators. For ultraviolet sensitivity one desirable combination is a combination of Michler's ketone and benzoin methyl ether (preferred ratio 2:5). Another useful combination is 2,2'-dimethoxy-2-phenylacetophenone, isopropylxanthone and ethyl paradimethylamino-benzoate. The later is preferably used with TMPTA to provide a radiation sensitive composition.

The amount of imaging photoinitiator in the radiation sensitive composition depends on the particular photosensitive material selected. It must be present in an amount sufficient to initiate the photochemistry within a short exposure time. As disclosed in commonly assigned application Ser. No. 466,704 filed Feb. 15, 1983, oxygen inhibits the imaging photochemistry. The photoinitiator may be used to sequester oxygen present in the microcapsules by conducting a non-imaging, oxygen sequestering pre-exposure or co-exposure as described in the aforementioned application which causes the initiator to react with the oxygen present without. When the photoinitiator is also relied upon for sequestering oxygen, it must be used in amounts sufficient to fulfill both this and its imaging functions.

The internal phase may additionally include a diluent oil. Inclusion of the oil will often improve half tone gradation in visual images. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls are generally less toxic and preferred.

A radiation sensitve composition as described above can be encapsulated in various wall formers using techniques known in the area of carbonless paper including coacervation, interfacial polymerization, polymerization of one or more monomers in an oil, as well as various melting, dispersing and cooling methods. Oil soluble materials have been encapsulated in hydrophilic wall-forming materials such as gelatin-type materials (see U.S. Pat. Nos. 2,730,456 and 2,800,457 to Green et al.) including gum arabic, polyvinyl alcohol, carboxymethyl-cellulose; resorcinol-formaldehyde wall formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kirintani et al.); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); andmelamine-formaldehyde resin and hydroxypropyl cellulose (see commonly assigned U.S. Pat. No. 4,025,455 to Shackle).

The material used to form the microcapsule walls must be selected for the radiation sensitive composition that is to be encapsulated such that it is substantially transparent to the exposure radiation. For the systems described above, urea-resorcinol-formaldehyde and gelatin microcapsules are generally preferred. The mean microcapsule size used in the present invention generally ranges from about 1 to 25 microns.

An open phase system may be used instead of discrete microcapsules. This can be done by dispersing what would otherwise be the internal phase throughout a binder as discrete droplets and coating the composition on the substrate. Suitable coatings for this embodiment include polymer binders whose viscosity has been adjusted to match the dispersion required in the coating. Suitable binders are gelatin, polyvinyl alcohol, polyacrylamide, and acrylic lattices The most common substrate for the photosensitive material of this invention is paper. The paper may be a commercial impact raw stock, or special grade paper such as cast-coated paper or chrome-rolled paper. The latter two papers are preferred when using microcapsules having a diameter between approximately 1 and 5 microns, because the surface of these papers is smoother and the microcapsules will not be easily embedded in the stock fibers. Transparent substrates such as polyethylene terephthalate and translucent substrates can also be used in this invention.

Imaging sheets embodying the invention imaging system can be exposed using a fairly simple exposure apparatus. In its simplest form for reflection imaging, the apparatus requires only a radiation source, means of focusing the exposure radiation from the original onto the imaging sheet, means to join the imaging sheet with the developer sheet (in the case of a transfer material), and means for rupturing the microcapsules. Simplified means such as this can be used with the invention because development is essentially a dry process with the internal phase and the pigment interacting in only infinitesimal droplets.

The present invention is further illustrated by the following non-limiting examples.

EXAMPLE 1

Photosensitive microcapsules were prepared as follows:

A mixture of 22.6 g 20.4% Isobam, 54.5 g water and 30.8 g gum arabic was heated with stirring to 60° C. and the pH was adjusted to 4.0 with the addition of 20% sulfuric acid. Thereafter 8.3 g urea and 0.8 g resorcinol were added and the solution was maintained a 60° C. to prepare a continuous phase. The continuous phase was placed in a Waring blender and a solution of 50 g TMPTA, 12 g Irgacure 151 (2,2'-dimethoxy-2-phenylacetophenone), 1 g Quantacure ITX (isopropyl thioxanthone), 1 g Quantacure EPD (ethyl para-dimethylamino benzoate and 6 g 50% Copikem X in dibutyl succinate was added at 60° C. with blending at 90 V for 90 seconds. Thereafter the speed of the blender was reduced to 40 V and 21.4 ml of 37% formaldehyde was added. Blending was continued at that speed for 2 hours at 60° C. The emulsion was then transferred to a metal beaker and 0.6 g of ammonium sulfate in 12.2 g water was added. This emulsion was stirred with an overhead mixer at 60° C. for another hour and the pH was adjusted to 9.0 using a 10% solution of sodium hydroxide. Finally, 2.8 g sodium bisulfite was dissolved in the mixture with stirring.

Transfer imaging sheets were prepared by coating microcapsule batches prepared as above on 80 pound Black and White (B & W) Enamel stock (a product of Mead Corporation), using a No. 12 meyer rod after diluting 1:1 with water containing 1% Triton-X 100 (Rohm and Haas Chemical Co.). The resultant coat weights ranged from about 3 to 6 g/m$^2$.

A black image-receiving sheet was prepared by coating a mixture of 1 g SD-74 (Sanko Chemical Co., Ltd.), 0.34 g BLMB (Hilton-Davis), 0.46 g MDG (Hilton-Davis), 0.14 g Int. R (Hilton-Davis) and 0.04 g Crystal Violet lactone in 20 ml toluene on 80 pound B & W raw stock. Over this was coated, as an opaque image-receiving layer, a composition consisting of 5 g Rhoplex P-310 (Rohm and Haas Co.) as a binder, 20 g water and 20 g Dylex 1183 pigment (Polysar) using a No. 10 Meyer rod.

The transfer sheet was exposed through a step wedge in a sensitometer equipped with one 15T8/BL and one 15T8/D fluorescent tube. The sample was nominally 10 to 12.5 cm from the tube surface. Following exposure, the sheet was passed through the nip between two pressure rollers in contact with the image-receiving sheet described above. Black images were visible through transparent windows in the opaque image-receiving layer.

EXAMPLE 2

This example illustrates an imaging material for forming a transparency. An image-receiving sheet was prepared by coating a mixture of 7 g Rhoplex P-310 (Rohm & Haas Co.), 20 g Dylex 1183 pigment, 20 g water and 2 drops Triton X-100 (Rohm & Haas Co.) on a xerographic transparent sheet (XF-10, Nashua Corporation). A transfer image sheet prepared and exposed as in Example 1 was assembled with the image-receiving sheet and passed through pressure rollers. In areas in which the transfer sheet was exposed, there was no change in the transmission density, but transparent images were observed in the areas corresponding to the unexposed areas of the transfer sheet.

Having described the invention in detail and with respect to specific embodiments thereof, it will be apparent that numerous variations and modifications are possible without departing from the scope of the following claims:

What is claimed is:

1. A photosensitive material comprising a microcapsule-containing layer including a plurality of rupturable microcapsules containing an internal phase, said internal phase including a radiation sensitive composition which undergoes a change in viscosity upon exposure to incident actinic radiation, and an image-receiving layer including a light-scattering pigment, said image-receiving layer being opaque, but having the capacity to be rendered transparent upon being contacted with said internal phase upon its release from said microcapsule-containing layer following exposure and development, said microcapsule-containing layer and said image-receiving layer being on the same or separate supports, wherein one image-wise exposing said microcapsule-containing layer to actinic radiation and rupturing said microcapsules, said internal phase is released from said microcapsules in the image areas and transferred to said image-receiving layer where it renders said image-receiving layer image-wise transparent.

2. The photosensitive material of claim 1 wherein said radiation sensitive composition is a photohardenable composition.

3. The photosensitive material of claim 2 wherein said microcapsules are microcapsules having a discrete microcapsule wall.

4. The photosensitive material of claim 3 wherein said pigment has an index of refraction which equals or is substantially the same as the index of refraction of said radiation curable composition.

5. The photosensitive material of claim 4 wherein said support underlying said image-receiving layer or a layer interposed between said support and said image-receiving layer is black or a color.

6. The photosensitive material of claim 1 wherein said support underlying said image-receiving layer or a layer interposed between said support and said image-receiving layer is black or a color.

7. The photosensitive material of claim 4 wherein said microcapsule-containing layer and said image-receiving layer are on separate supports.

8. The photosensitive material of claim 4 wherein said microcapsule-containing layer and said image-receiving layer are on the same support.

9. The photosensitive material of claim 4 wherein said radiation curable material includes a polyethylenically unsaturated monomer and a photoinitiator.

10. A process for forming images which comprises image-wise exposing to actinic radiation at least the microcapsule-containing layer of photosensitive material including:

a microcapsule-containing layer including a plurality of rupturable microcapsules containing an internal phase, said internal phase including a radiation sensitive composition which undergoes a change in viscosity upon exposure to incident actinic radiation, and an image-receiving layer including a light-scattering pigment, said image-receiving layer being opaque but having the capacity to be rendered transparent upon being contacted with said internal phase released from said microcapsule-containing layer, said microcapsule-containing layer and said image-receiving layer being on the same or separate supports, and rupturing said microcapsules such that said internal phase is released from said microcapsule-containing layer in the image areas and contacts said image-receiving layer thereby rendering it image-wide transparent.

11. The process of claim 18 wherein said microcapsule-containing layer and said image-receiving layer are on separate supports and said exposure step comprises exposing said microcapsule-containing layer to actinic radiation, and, following said exposure, said microcapsule-containing layer is assembled with said image-receiving layer and said internal phase is transferred to said image-receiving layer in the image areas whereupon said image-receiving layer is rendered image-wise transparent.

12. The process of claim 18 wherein said microcapsule-containing layer and said image-receiving layer are on the same support.

13. The process of claim 18 wherein the support for said image-receiving layer or a layer interposed between said image-receiving layer and said support is black or a color.

14. The process of claim 18 which additionally comprises uniformly exposing at least said microcapsule-containing layer to a radiation of an intensity insufficient to alter the viscosity of said radiation sensitive material but sufficient to sequester oxygen present in said microcapsules.

15. The process of claim 10 wherein said radiation sensitive material is a radiation curable material.

16. The process of claim 15 wherein said microcapsules are microcapsules having a discrete microcapsule wall.

17. The process of claim 16 wherein said pigment has an index of refraction which matches or is substantially the same as the index of refraction of said internal phase.

18. The process of claim 17 wherein said radiation curable material is a polyethylenically unsaturated compound.

* * * * *